United States Patent
Wang et al.

(10) Patent No.: US 10,331,026 B2
(45) Date of Patent: Jun. 25, 2019

(54) PHOTOGRAPHIC MASK AND METHOD FOR MAKING SAME

(71) Applicants: Linlin Wang, Shenzhen (CN); Ye Zhou, Shenzhen (CN); ChengYen Liu, Shenzhen (CN); Zhenkui Meng, Shenzhen (CN)

(72) Inventors: Linlin Wang, Shenzhen (CN); Ye Zhou, Shenzhen (CN); ChengYen Liu, Shenzhen (CN); Zhenkui Meng, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 23 days.

(21) Appl. No.: 15/070,134

(22) Filed: Mar. 15, 2016

(65) Prior Publication Data
US 2017/0031238 A1    Feb. 2, 2017

(30) Foreign Application Priority Data

Jul. 31, 2015 (CN) .......................... 2015 1 0464792

(51) Int. Cl.
*G03F 1/42* (2012.01)
*G03F 1/50* (2012.01)

(52) U.S. Cl.
CPC .................. *G03F 1/42* (2013.01); *G03F 1/50* (2013.01); *H04R 2201/003* (2013.01)

(58) Field of Classification Search
CPC ..................................... G03F 1/42; G03F 1/50
See application file for complete search history.

(56) References Cited

U.S. PATENT DOCUMENTS

2004/0141894 A1* 7/2004 Mizuno ................ B01D 53/885
422/201
2006/0222967 A1* 10/2006 Okino .................... B82Y 10/00
430/5

* cited by examiner

*Primary Examiner* — Daborah Chacko-Davis
(74) *Attorney, Agent, or Firm* — Na Xu; IPro, PLLC (57) ABSTRACT

A photographic mask is provided in the present disclosure. The photographic mask includes a silicon-on-insulator (SOI) base and a stepped opening formed in the SOI base. The SOI base includes a silicon substrate, a median layer and a silicon layer, the median layer is arranged between the insulator substrate and the insulator layer. The stepped opening includes a first opening portion and a second opening portion, the first opening portion penetrates through the silicon layer and has a first opening area; the second opening portion at least penetrates through the silicon substrate and is aligned with the first opening portion. The second opening portion has a second opening area greater than the first opening area of the first opening portion. The present disclosure further provides a method for making a photographic mask.

10 Claims, 9 Drawing Sheets

FIG. 6g

PHOTOGRAPHIC MASK AND METHOD FOR MAKING SAME

FIELD OF THE DISCLOSURE

The present disclosure relates to microphone manufacturing technologies, and more particularly, to a photographic mask used in a manufacturing process of a micro-electro-mechanic system (MEMS) microphone and a method for making the photographic mask.

BACKGROUND

MEMS microphone are widely used in mobile terminals, such as mobile phones, tablet computers, laptop computers, portable game players, portable multimedia devices, or the like, and serve as a sound pickup device for converting the sound into an electrical signal.

A MEMS microphone chip includes a vibration membrane and a back plate bonded to each other for forming a MEMS acoustic sensing capacitor. The vibration membrane includes a membrane connecting pad, and the back plate includes a back plate connecting pad; the membrane connecting pad and the back plate connecting pad are provided to output an acoustic sensing signal generated by the MEMS microphone chip to a signal processing chip.

The membrane connecting pad and the back plate connecting pad are generally formed in the MEMS microphone chip by using a shadow mask. The shadow mask provides two openings respectively for depositing the membrane connecting pad and the back plate connecting pad. Each of the membrane connecting pad and the back plate connecting pad normally has a small size, e.g., 100 μm×100 μm; therefore, in a related shadow mask, the opening is designed to have an inverted cone structure with a large top opening area, e.g., 460 μm×460 μm. However, the large top opening area of the opening makes it difficult to form multiple openings in the vibration membrane or the back plate, and moreover, the large top opening area may also lower an alignment accuracy between the shadow mask and the MEMS microphone chip.

Therefore, it is desired to provide a photographic mask and a method for making the photographic mask which can overcome the aforesaid problems.

BRIEF DESCRIPTION OF THE DRAWINGS

Many aspects of the embodiment can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and the embodiment thereof.

The present disclosure provides a photographic mask which can be used in a manufacturing process of a MEMS microphone for forming a membrane connecting pad and a back plate connecting pad in an MEM microphone chip. The photographic mask may also be applied for making other connecting pads in an objective device, and the following description takes the membrane connecting pad and the back plate connecting pad in the MEM microphone chip as an example. The photographic mask as provided in the present disclosure uses a silicon-on-insulator (SOI) base, and stepped openings are provided in the SOI base for forming the membrane connecting pad and the back plate connecting pad.

Figure 1:
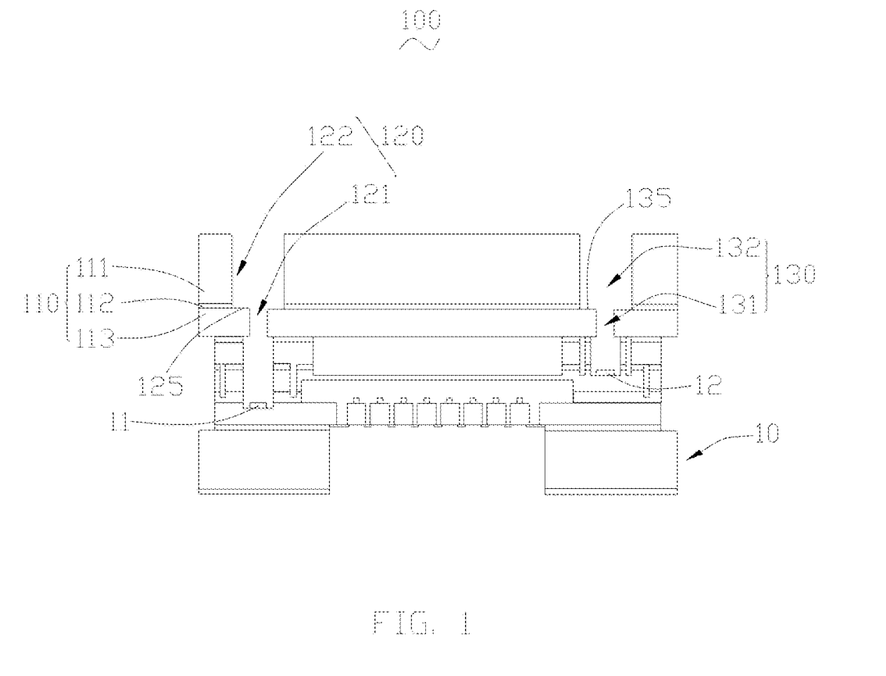
FIG. 1 is a schematic view of a photographic mask according to a first embodiment of the present disclosure.

Referring to FIG. 1, a schematic view of a photographic mask 100 according to a first embodiment of the present disclosure is shown. The photographic mask 100 may be arranged on and aligned with a MEMS microphone chip 10, so as to form a back plate connecting pad 11 and a membrane connecting pad 12 in the microphone chip 10. The photographic mask 100 includes an SOI base 110, a first stepped opening 120 and a second stepped opening 130. The first stepped opening 120 and the second stepped opening 130 are respectively formed in the SOI base 110 and are apart from each other. For example, the first stepped opening 120 and the second stepped opening 130 may be respectively located at a first position corresponding to the back plate connecting pad 11 and a second position corresponding to the membrane connecting pad 12.

The SOI base 110 includes a silicon substrate 111, a median layer 112 formed on the silicon base 111, and a silicon layer 113 formed on the median layer 112. The silicon substrate 111 may be a mono-crystalline silicon substrate. The median layer 112 is arranged between the silicon substrate 111 and the silicon layer 113, and may be a median insulator layer such as a buried silicon dioxide layer. The silicon layer 113 may be a mono-crystalline silicon layer grown from the median layer 112 by epitaxial growth process.

The silicon substrate 111 and the silicon layer 113 serve as a bottom substrate and a top silicon layer of the SOI base 110 in the present embodiment, the silicon substrate 111, the median layer 112 and the silicon layer 113 are stacked in that order from bottom to top to form an SOI structure. Moreover, when the photographic mask 100 is arranged on the MEMS microphone chip 10 for forming the back plate connecting pad 11 and the membrane connecting pad 12, the photographic mask 100 needs to be turned over to make the silicon layer 113 be adjacent to the MEMS microphone chip 10, as illustrated in FIG. 1.

The first stepped opening 120 and the second stepped opening 130 respectively correspond to the back plate connecting pad 11 and the membrane connecting pad 12 of the MEMS microphone chip 10, and may be formed in the SOI base 110 by deep reactive ion etching (DRIE) process. Each of first stepped opening 120 and the second stepped opening 130 may be a through hole penetrating through the silicon substrate 111, the median layer 112 and the silicon layer 113, and has a single-step inner profile.

Specifically, the first stepped opening 120 includes a first opening portion 121 and a second opening portion 122. The first opening portion 121 penetrates through the silicon layer 113, and is located at the first position corresponding to the back plate connecting pad 11. The second opening portion 122 is aligned with the first opening portion 121, and penetrates through both the silicon substrate 111 and the median layer 112 to be communicated with communicate with the first opening portion 121.

In particular, an opening shape and an opening area of the first opening portion 121 match the back plate connecting pad 11; an opening shape of the second opening portion 122 is coincident with that of the first opening portion 121, however, an opening area of the second opening portion 122 is greater than that of the first opening portion 121. In addition, a central of the second opening portion 122 may be aligned with that of the first opening portion 121. As such, the second opening portion 122 and the first opening portion 121 cooperatively form a first single-step opening structure with a first stepped surface 125; the first stepped surface 125 is located between the silicon layer 113 and the median layer 112, and surrounds the first opening portion 121.

The second stepped opening 130 may have a configuration substantially same as the first stepped opening 120. Similarly, the second stepped opening 130 includes a third opening portion 131 and a fourth opening portion 132. The third opening portion 131 also penetrates through the silicon layer 113, and is located at the second position corresponding to the membrane connecting pad 12. The fourth opening portion 132 is aligned with the third opening portion 131 and also penetrates through both the silicon substrate 111 and the median layer 112 to be communicated with the third opening portion 131.

In particular, an opening shape and an opening area of the third opening portion 131 match the membrane connecting pad 12; an opening shape of the fourth opening portion 132 is coincident with that of the third opening portion 131, however, an opening area of the fourth opening portion 132 is greater than that of the third opening portion 131. In addition, a central of the fourth opening portion 132 may be aligned with that of the third opening portion 131. As such, the fourth opening portion 132 and the third opening portion 131 cooperatively form a second single-step opening structure with a second stepped surface 135; the second stepped surface 135 is located between the silicon layer 113 and the median layer 112, and surrounds the third opening portion 131.

When the photographic mask 100 is used to form the back plate connecting pad 11 and the membrane connecting pad 12 in the MEMS microphone chip 10, the photographic mask 100 is arranged on and aligned with the MEMS microphone chip 10, such that the first opening portion 121 of the first stepped opening 120 and the third opening portion 131 of the second stepped opening 130 to be respectively arranged at the first position corresponding to the back plate connecting pad 11 and the second position corresponding to the membrane connecting pad 12. In the related contexts, the back plate connecting pad 11 and the membrane connecting pad 12 should be interpreted as a to-be-formed back plate connecting pad and a to-be-formed membrane connecting pad. Moreover, metal deposition process may further be implemented to the MEMS microphone chip 10 via the first stepped opening 120 and the second stepped opening 130 of the photographic mask 100. As such, the back plate connecting pad 11 and the membrane connecting pad 12 can be formed on the MEMS microphone chip 10 at the first position and the second position respectively.

In particular, two deposition holes may be provided in the MEMS microphone chip 10 at the first position and the second position respectively, and the two deposition holes extend to pre-formed internal connecting lines of a back plate and a vibration membrane of the MEMS microphone chip 10; when the photographic mask 100 is arranged on the MEMS microphone chip 10, the first stepped opening 120 and the second stepped opening 130 are aligned with the two deposition holes respectively. With this configuration, after the metal deposition process, the back plate connecting pad 11 and the membrane connecting pad 12 are formed in the two deposition holes respectively, and are electrically connected to the back plate and the vibration membrane of the MEMS microphone chip 10 via the internal connection lines.

The photographic mask 100 in the present disclosure provides stepped openings 120 and 130 for forming the connecting pads 11 and 12 in the MEMS microphone chip 10, each of the stepped openings 120 and 130 has a smaller opening area configuration compared with inverted cone shaped openings, and therefore, the photographic mask 100 can ensure the MEMS microphone chip 10 to have sufficient area to form multiple openings as needed. Furthermore, the photographic mask 100 can also enable the MEMS microphone chip 10 to preserve alignment area for forming alignment masks, which can further improve alignment between the photographic mask 100 and the MEMS microphone chip 10, and thus a manufacturing quality of the MEMS microphone chip 10 can also be increased.

The present disclosure further provides a method for making a photographic mask, which can be used to make the photographic mask 100 as illustrated FIG. 1. Referring to FIGS. 2a-2f, the method for making the photographic mask mainly includes the following steps.

Figure 2A:
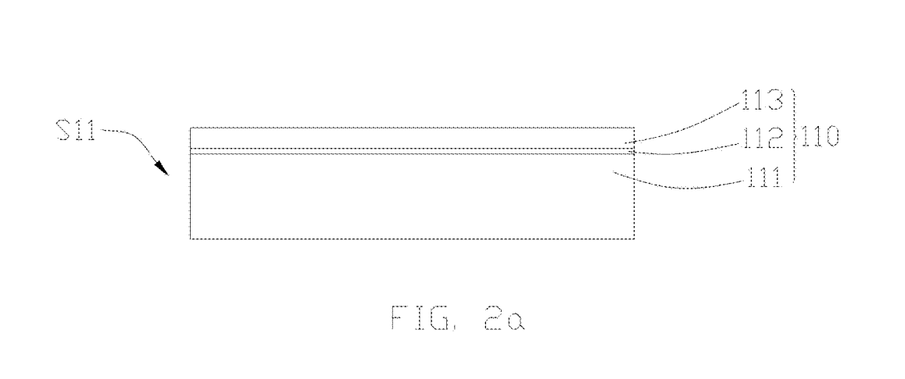
FIG. 2a-2f schematically illustrates a method for making the photographic mask of FIG. 1.

Step S11, an SOI base 110 in provided. The SOI base 110 includes a silicon substrate 111, a median layer 112 and a silicon layer 113, which are stacked in that order from bottom to top for forming an SOI structure, as illustrated in FIG. 2a.

Figure 2B:
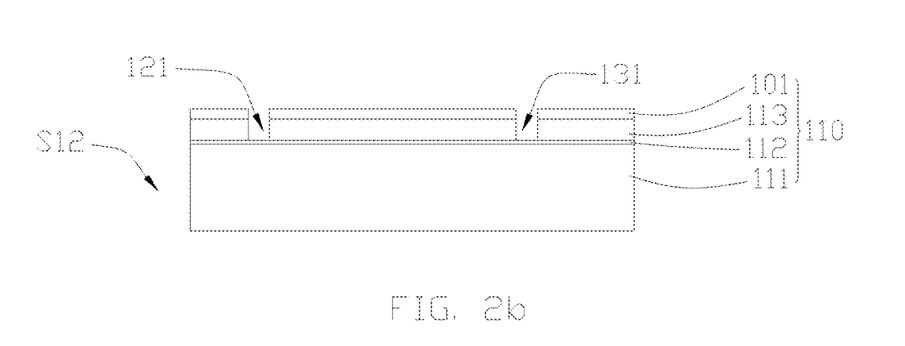

Step S12, a first photoresistor layer 101 is coated on the silicon layer 113, and then a first opening portion 121 and a third opening portion 131 are etched out from the silicon layer 113 via the first photoresistor layer 101.

Referring to FIG. 2b, in step S12, a first photoresistor layer 101 is firstly coated on the silicon layer 113 of the SOI base 110, and then the silicon layer 113 is etched at a first position corresponding to a to-be-formed back plate connecting pad and at a second position corresponding to a to-be-formed membrane connecting pad by DRIE process; after the DRIE process is implemented, a first opening portion 121 and a third opening portion 131 are respectively formed in the first position and the second position of the silicon layer 113 of the SOI base 110. The first opening portion 121 and the third opening portion 131 are both cylindrical opening portions penetrating through the silicon layer 113.

In the DRIE process according to the present embodiment, shapes and opening areas of the first opening portion 121 and the third opening portion 131 are designed to be substantially same as the to-be-formed back plate connecting pad and the to-be-formed membrane connecting pad respectively, such that the first opening portion 121 and the third opening portion 131 can be used to form the connecting pads. In the present embodiment, the DRIE process can control an etching range of the first opening portion 121 and the third opening portion 131 accurately, and thus ensuring the shapes and the opening areas of the first opening portion 121 and the third opening portion 131 meet manufacturing requirements of the back plate connecting pad and the membrane connecting pad.

Figure 2C:
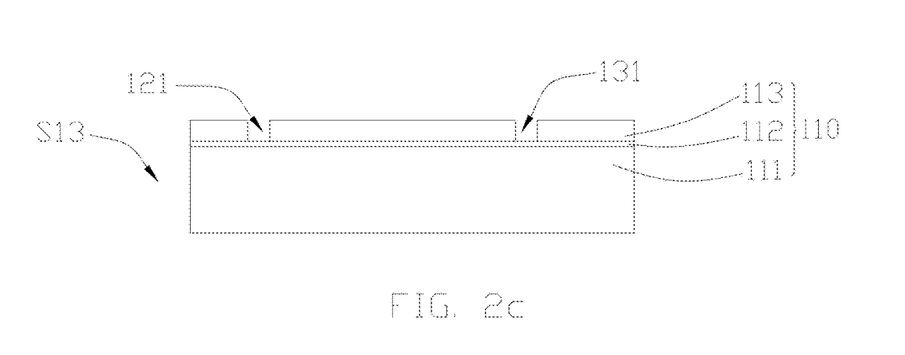

Step S13, the first photoresist layer 101 is removed from the silicon layer 113 after the first opening portion 121 and the third opening portion 131 are formed, as illustrated in FIG. 2c.

Figure 2D:
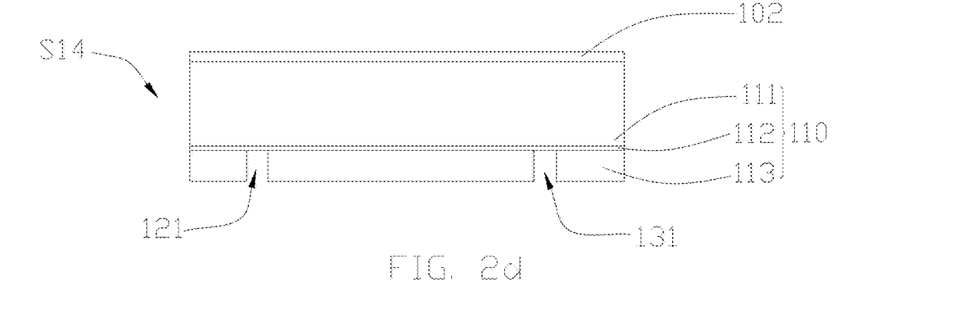

Step S14, the SOI base 110 is turned over, and a second photoresistor layer 102 is coated on the silicon substrate 111 of the SOI base 110.

Referring to FIG. 2d, after the first photoresistor layer 101 is removed from the silicon layer 113 in step S13, the SOI base 110 is turned over to make the silicon substrate 111 thereof be upward, and then a surface of the silicon substrate 111 is coated with photoresistor material to form a second photoresistor layer 102 thereon.

Figure 2E:
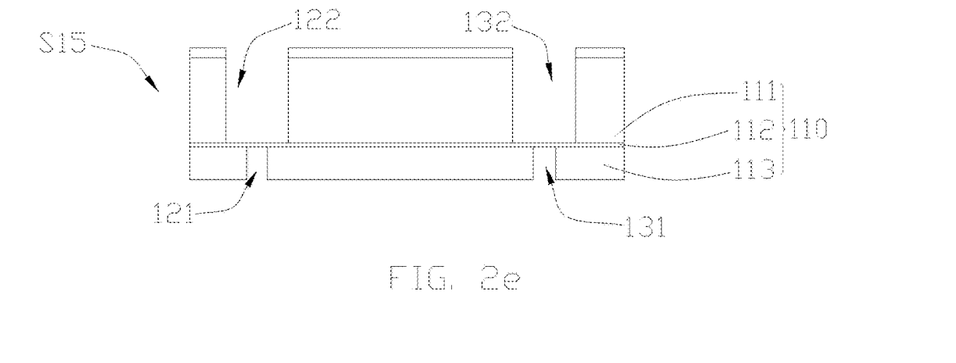

Step S15, a second opening portion 122 and a fourth opening portion 132 are etched out from the silicon substrate 111 via the second photoresistor layer 102.

Referring to FIG. 2e, after the second photoresistor layer 102 is coated on the silicon substrate 113, the silicon substrate 111 is etched to form the second opening portion 122 and the fourth opening portion 132 by etching process such as DRIE process. In particular, each of the second opening portion 122 and the fourth opening portion 132 may also be designed as a cylindrical opening portion penetrating through the silicon substrate 111, and has an opening area greater than that of the first opening portion 121 and the third opening portion 131. Moreover, the etching process in step S15 is implemented at the first position and the second position, such that after being etched out, the second opening portion 122 and the fourth opening portion 132 are opposite to and aligned with the first opening portion 121 and the third opening portion 131 respectively.

In step S15, the etching process is merely implemented on the silicon substrate 111, in other words, the median layer 112 is not etched. As such, after the second opening portion 122 and the fourth opening portion 132 are etched out, the median layer 112 still exists between the first opening portion 121 and the second opening portion 122, as well as between the third opening portion 131 and the fourth opening portion 132, as illustrated in FIG. 2e.

Figure 2F:
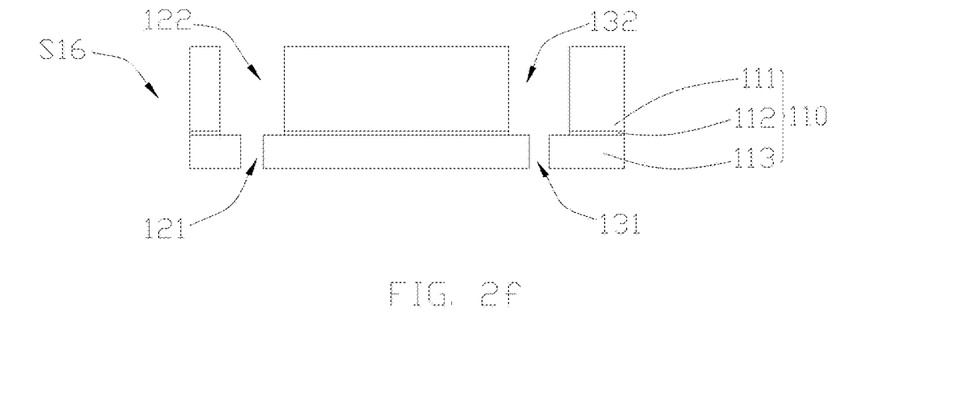

Step S16, the median layer 112 is etched via the second opening portion 122 and the fourth opening portion 132 to form a first stepped opening and a second stepped opening.

Referring to FIG. 2f, in step S16, the second photoresistor layer 102 is removed from the silicon substrate 111, and in addition, the median layer 112 between the first opening portion 121 and the second opening portion 122, as well as between the third opening portion 131 and the fourth opening portion 132, is also etched via the second opening portion 122 and the fourth opening portion 132. After the median layer 112 is etched, the second opening portion 122 extends to and is communicated with the first opening portion 121; similarly, the fourth opening portion 132 extends to and is communicated with the third opening portion 131. According, a first stepped opening with a first stepped surface is formed by the first opening potion 121 and the second opening portion 122, and a second stepped opening with a second stepped surface is formed by the third opening portion 131 and the fourth opening portion 132.

It should be noted that a sequence of steps S11-S16 in the method for making the photographic mask 100 as illustrated in FIGS. 2a-2f is not limited to the above description; for example, in an alternatively embodiment, the second opening portion 122 and the fourth opening portion 132 may be formed before the first opening portion 121 and the third opening portion 131 is etched out from the silicon layer 113; the second opening portion 122 and the fourth opening portion 132 may alternatively penetrate through both the silicon substrate 111 and the median layer 112 in a one etching process, in other words, the silicon substrate 111 and the median layer 112 is etched in a same etching process, rather than being etched separately.

Figure 3:
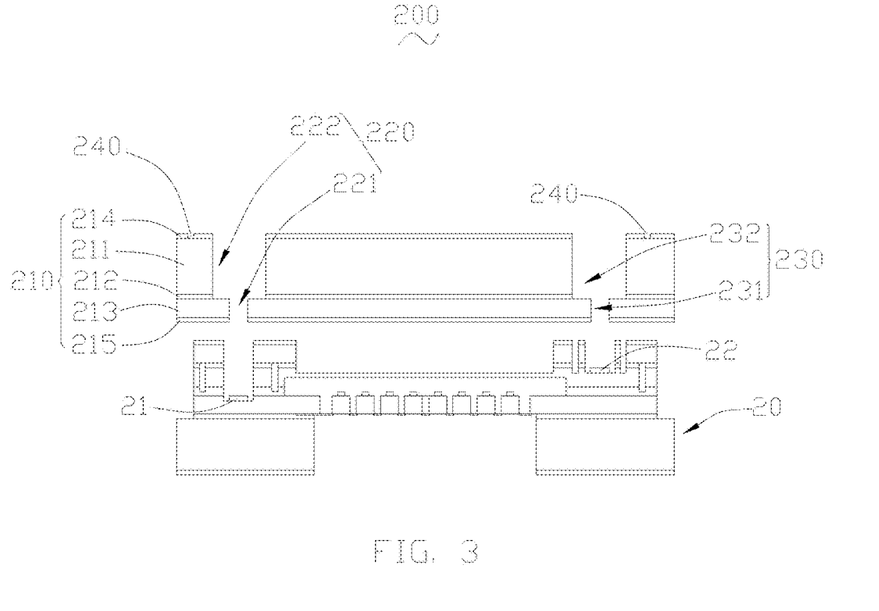
FIG. 3 is a schematic view of a photographic mask according to a second embodiment of the present disclosure.

FIG. 3 illustrates a photographic mask 200 according to a second embodiment of the present disclosure. The photographic mask 200 can also be arranged on and aligned with a MEMS microphone chip 20 for forming a back plate connecting pad 21 and a membrane connecting pad 22 in the microphone chip 20. As illustrated in FIG. 3, the photographic mask 200 according to the second embodiment is similar to the aforesaid photographic mask 100 as illustrated in FIG. 1, but differs in some aspects which are described as follow.

The photographic mask 200 also includes an SOI base 210, a first stepped opening 220, a second stepped opening 230; the first stepped opening 220 and the second stepped opening 230 are respectively formed in the SOI base 210 at a first position corresponding to the back plate connecting pad 21 and a second position corresponding to the membrane connecting pad 22. In the present embodiment, the SOI base 210 includes a silicon substrate 211, a median layer 212 and a silicon layer 213 stacked sequentially as the SOI base 110 of the aforesaid photographic mask 100; besides, the SOI base 210 further includes a first insulator layer 214 formed on the silicon substrate 211, and a second insulator layer 215 formed on the silicon layer 213. The first insulator layer 214 and the second insulator layer 215 may both be silicon dioxide layers.

The first stepped opening 220 includes a first opening portion 221 penetrating though both the silicon layer 213 and the second insulator layer 215, and a second opening portion 222 penetrating through the median layer 212, the silicon substrate 211 and the first insulator layer 214. The first opening portion 221 is located at the first position corresponding to the back plate connecting pad 21, and has an opening area matching the back plate connecting pad 21; the second opening portion 222 is aligned with the first opening portion 221, and has an opening area greater than that of the first opening portion 221. Accordingly the first stepped opening 220 has a first single-step opening structure with a first stepped surface.

The second stepped opening 230 includes a third opening portion 231 penetrating though both the silicon layer 213 and the second insulator layer 215, and a fourth opening portion 232 penetrating through the median layer 212, the silicon substrate 211 and the first insulator layer 214. The third opening portion 231 is located at the second position corresponding to the membrane connecting pad 22; the fourth opening portion 232 is aligned with and communicated with the third opening portion 231. Moreover, the third opening portion 231 has an opening area matching the membrane connecting pad 22, and the fourth opening portion 232 has an opening area greater than that of the third opening portion 231. Accordingly, the second stepped opening 230 has a second single-step opening structure with a second stepped surface.

Furthermore, the photographic mask 200 may further include a pair of alignment marks 240. The alignment masks 240 may be etched out from the first insulator layer 214, and are formed at peripheral regions of the first stepped opening 220 and the second stepped opening 230. For example, the alignment marks 240 may be formed at margins of the first insulator layer 214, so as not to impact metal deposition of the back plate connecting pad 21 and the membrane connecting pad 22 via the first stepped opening 220 and the second stepped opening 230. The alignment marks 240 as provided in the present embodiment can ensure the photographic mask 200 to be accurately aligned with the MEMS microphone chip 20, and thus manufacturing accuracy of the back plate connecting pad 21 and the membrane connecting pad 22 is further improved.

Alternatively, the alignment masks 240 may be formed in other layers of the photographic mask 200; for example, the alignment masks 240 may be preformed either in the second insulator layer 215 or the median layer 212; in other embodiments, the alignment masks 240 may alternatively be formed in the silicon substrate 211 or the silicon layer 213.

In the present embodiment, due to the second insulator layer 215 formed on the silicon layer 213, the photographic mask 200 and the MEMS microphone chip 20 can easily realize temporary bonding for making the back plate connecting pad 21 and the membrane connecting pad 22; and since the photographic mask 200 is bonded to the MEMS microphone chip 20 via the second insulator layer 215, after the connecting pads 21 and 22 is formed, the photographic mask 200 can be de-bonded from the MEMS microphone chip 20 easily.

The present disclosure further provides a method for making a photographic mask, which can be used to make the photographic mask 200 as illustrated FIG. 3. The method for make the photographic mask 200 is similar to the aforesaid method for making the photographic mask 100. Referring to FIGS. 4a-4f, the method for making the photographic mask 200 mainly includes the following steps.

Figure 4A:
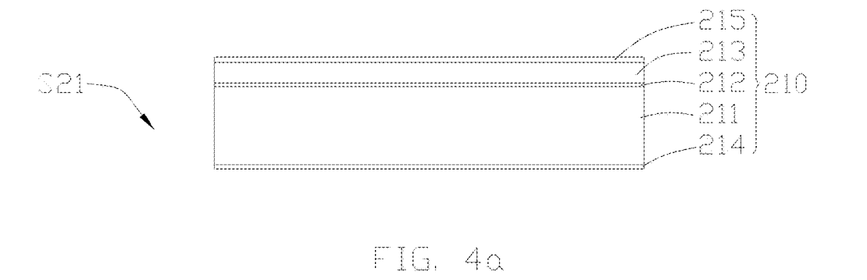
FIG. 4a-4f schematically illustrates a method for making the photographic mask of FIG. 3.

Step S21, an SOI base 210 in provided.

As illustrated in FIG. 4a, the SOI base 210 includes a silicon substrate 211, a median layer 212, a silicon layer 213, a first insulator layer 214 and a second insulator layer 215. The silicon layer 213, the median layer 212 and the silicon substrate 211 are stacked sequentially for forming an SOI structure; the first insulator layer 214 and the second insulator layer 215 are respectively formed on the silicon substrate 211 and the silicon layer 213.

Figure 4B:
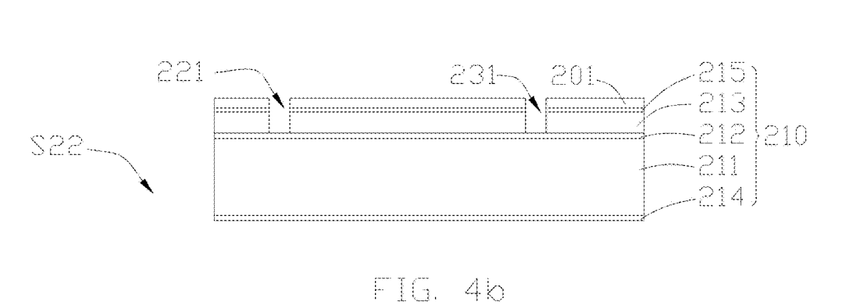

Step S22, a first photoresistor layer 201 is coated on the second insulator layer 215, and a first opening portion 221 and a third opening portion 231 are etched out from the second insulator layer 215 and the silicon layer 213 via the first photoresistor layer 201.

Referring to FIG. 4b, in step S22, a first photoresistor layer 201 is firstly coated on the second insulator layer 215 of the SOI base 210, and then the second insulator layer 215 and the silicon layer 213 covered by the second insulator layer 215 are etched at a first position corresponding to a to-be-formed back plate connecting pad and at a second position corresponding to a to-be-formed membrane connecting pad by DRIE process; after the DRIE process is implemented, a first opening portion 221 and a third opening portion 231 are respectively formed in the first position and the second position of the SOI base 210. The first opening portion 221 and the third opening portion 231 are both cylindrical opening portions penetrating through both the second insulator layer 215 and the silicon layer 213.

Figure 4C:
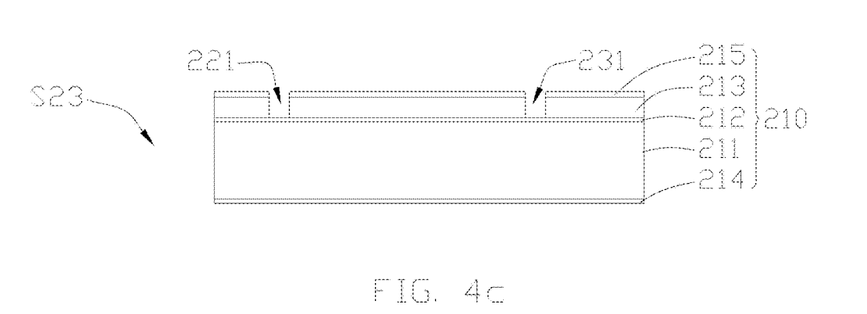

Step S23, the first photoresistor layer 201 is removed from the second insulator layer 215 after the first opening portion 221 and the third opening portion 231 are formed, as illustrated in FIG. 4c.

Figure 4D:
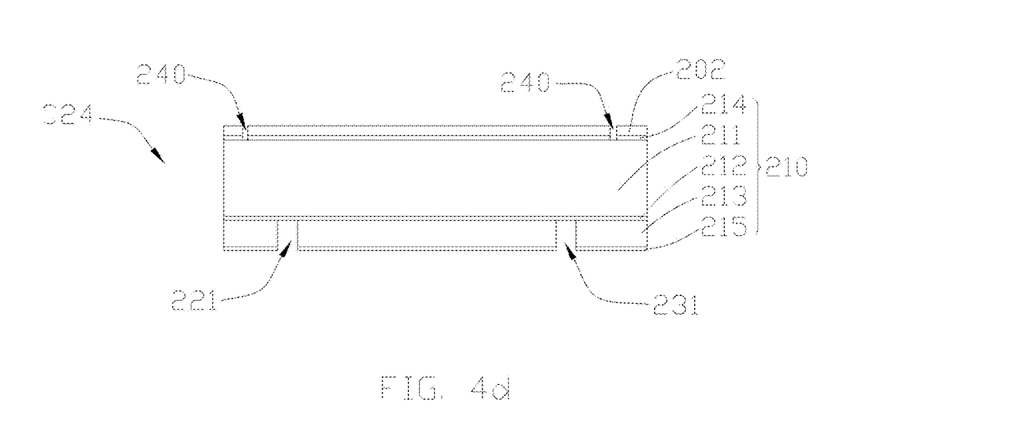

Step S24, the SOI base 210 is turned over, a second photoresistor layer 202 is coated on the first insulator layer 214, and a plurality of alignment masks 240 are formed on the first insulator layer 214 via the second photoresistor layer 202.

Referring to FIG. 4d, after the first photoresistor layer 201 is removed from the second insulator layer 215 in step S23, the SOI base 210 is turned over to make the first insulator layer 214 thereof be upward, and then a surface of the first insulator layer 214 is coated with photoresistor material to form a second photoresistor layer 202 thereon. After that, the first insulator layer 214 is etched via the second photoresistor layer 202 to form the alignment masks 240, and in the present embodiment, the alignment masks 240 may be etched out at a margin of the first insulator layer 214.

Figure 4E:
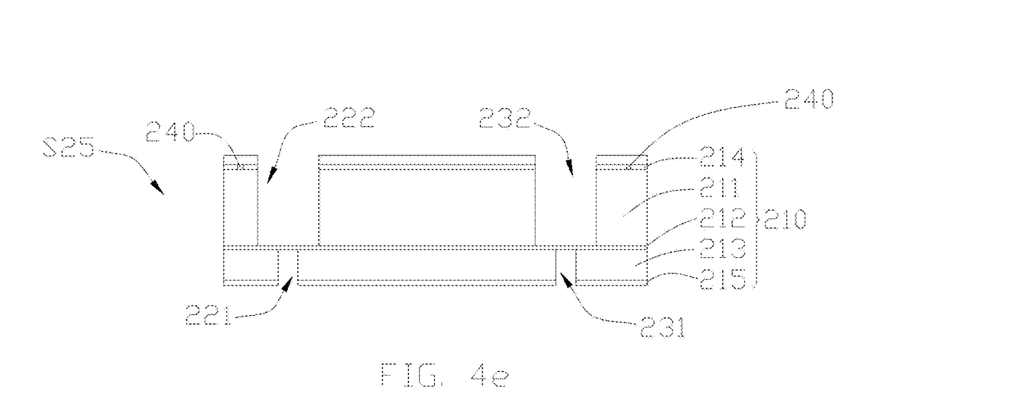

Step S25, a second opening portion 222 and a fourth opening portion 232 are etched out from the first insulator layer 214 and the silicon substrate 211.

Referring to FIG. 4e, after the alignment masks 240 are formed on the first insulator layer 214, a third photoresistor layer may further be coated on the first insulator layer 214 and cover the alignment masks 240; and then etching process (such as DRIE process) is implemented in the first insulator layer 214 and the silicon substrate 211 to form the second opening portion 222 and the fourth opening portion 232. In particular, each of the second opening portion 222 and the fourth opening portion 232 may also be a cylindrical opening portion penetrating through the first insulator layer 214 and the silicon substrate 211, and has an opening area greater than that of the first opening portion 221 and the third opening portion 231. After being etched out, the second opening portion 222 and the fourth opening portion 232 are opposite to and aligned with the first opening portion 221 and the third opening portion 231 respectively, with the median layer 212 existing therebetween.

Figure 4F:
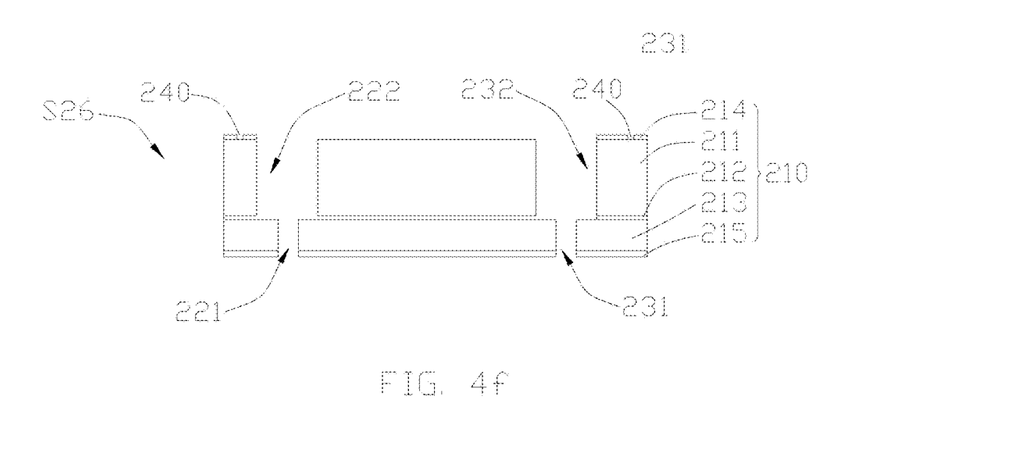

Step S26, the median layer 212 is etched via the second opening portion 222 and the fourth opening portion 232 to form a first stepped opening and a second stepped opening.

Referring to FIG. 4f, in step S26, the third photoresistor layer is removed from the first insulator layer 214 to expose the alignment masks 240, and in addition, the median layer 212 between the first opening portion 221 and the second opening portion 222, as well as between the third opening portion 231 and the fourth opening portion 232, is also etched via the second opening portion 222 and the fourth opening portion 232. After the median layer 212 is etched, the second opening portion 222 extends to and is communicated with the first opening portion 221, and the fourth opening portion 232 extends to and is communicated with the third opening portion 231; both the second opening portion 222 and the fourth opening portion 232 penetrate through the first insulator layer 214, the silicon substrate 211 and the median layer 212.

According, a first stepped opening with a first stepped surface is formed by the first opening potion 221 and the second opening portion 222, and a second stepped opening with a second stepped surface is formed by the third opening portion 231 and the fourth opening portion 232.

Similar to the method for making the photographic mask 100, a sequence of steps S21-S26 in the method for making the photographic mask 200 as illustrated in FIGS. 4a-4f is not limited to the above description.

Furthermore, when the alignment masks 240 are formed in the second insulator layer 215, step S24 may be replaced by: etching out the alignment masks 240 from the second insulator layer 215 of the SOI base 210. In addition, the alignment masks 240 may be formed before the first opening portion 221 and the third opening portion 231 being etched out in step S22, or after the first opening portion 221 and the third opening portion 231 being etched out in step S22, or before the first photoresistor layer 201 is removed from second insulator layer 215 in step S23. When the alignment masks 240 are formed in the silicon substrate 211, the silicon layer 213 or the median insulator layer 214, the alignment masks 240 is pre-formed in the SOI base 210 provided in step S21, and in this circumstance, steps S24 can be omitted.

Figure 5:
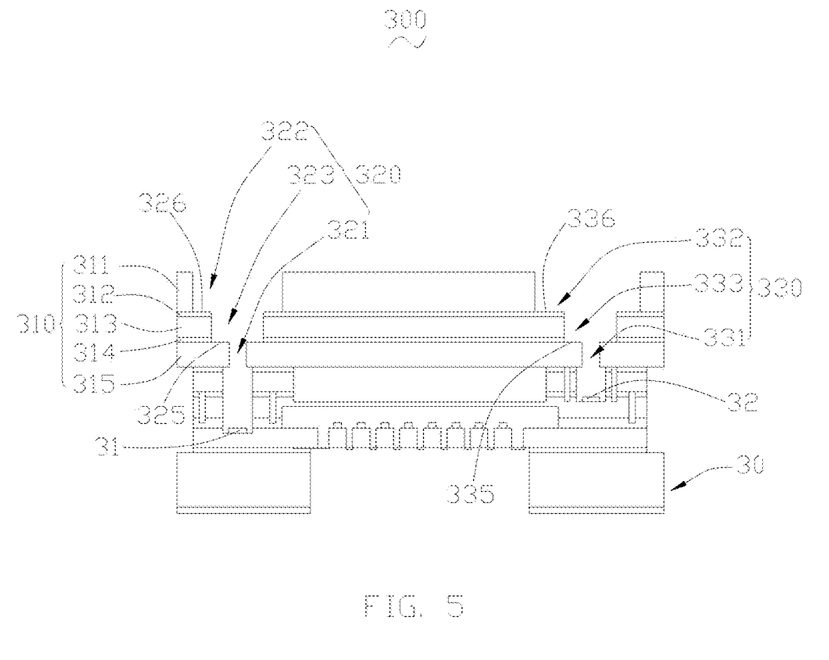
FIG. 5 is a schematic view of a photographic mask according to a third embodiment of the present disclosure.

FIG. 5 illustrates a photographic mask 300 according to a third embodiment of the present disclosure. The photographic mask 300 can also be arranged on and aligned with a MEMS microphone chip 30 for forming a back plate connecting pad 31 and a membrane connecting pad 32 in the microphone chip 30. As illustrated in FIG. 5, the photographic mask 300 according to the third embodiment is similar to the aforesaid photographic mask 100 as illustrated in FIG. 1, but differs in some aspects described as follow.

The photographic mask 300 also includes an SOI base 310, a first stepped opening 320, a second stepped opening 330; the first stepped opening 320 and the second stepped opening 330 are respectively formed in the SOI base 310 at a first position corresponding to the back plate connecting pad 31 and a second position corresponding to the membrane connecting pad 32.

The SOI base 310 includes a silicon substrate 311 serving as a bottom substrate, a silicon layer 315 serving as a top silicon layer, and a median layer 312-314 arranged between the silicon substrate 311 and the silicon layer 315. In the present embodiment, the median layer 312-314 typically includes a first median insulator layer 312, a median silicon layer 313 and a second median insulator layer 314. The silicon substrate 311, the first median insulator layer 312, the median silicon layer 313, the second median insulator layer 314 and the top silicon layer 315 are stacked in that order from bottom to top. The first median insulator layer 312 and the second median insulator layer 314 may both be silicon dioxide layers, which are sandwiched between the silicon substrate 311, the median silicon layer 313 and the top silicon layer 315 for forming a multi-layers SOI structure.

In the present embodiment, each of the first stepped opening 320 and the second stepped opening 330 has a two-steps opening structure with two stepped surfaces.

Specifically, the first stepped opening 320 includes a first opening portion 321 penetrating though the top silicon layer 315, a second opening portion 322 penetrating though the silicon substrate 311, and a third opening portion 323 penetrating though the first median insulator layer 312, the median silicon layer 313 and the second median insulator layer 314. The first opening portion 321 is located at the first position corresponding to the back plate connecting pad 31, the second opening portion 322 and the third opening portion 323 are aligned with first opening portion 321, and the second opening portion 322 is communicated with the first opening portion 321 via the third opening portion 323. Moreover, the first opening portion 321 has an opening area matching the back plate connecting pad 31, and the second opening portion 322 has an opening area greater than that of the first opening portion 321; the third opening portion 323 has an opening area greater than that of the first opening portion 321, but smaller than that of the second opening portion 322. Accordingly, the first stepped opening 320 has a first two-steps opening structure with a first stepped surface 325 and a second stepped surface 326, as illustrated in FIG. 5.

Similarly, the second stepped opening 330 includes a fourth opening portion 331 penetrating though the top silicon layer 315, a fifth opening portion 332 penetrating though the silicon substrate 311, and a sixth opening portion 333 penetrating though the first median insulator layer 312, the median silicon layer 313 and the second median insulator layer 314. The fourth opening portion 331 is located at the second position corresponding to the membrane connecting pad 32, the fifth opening portion 332 and the sixth opening portion 333 are aligned with fourth opening portion 331, and the fifth opening portion 332 is communicated with the fourth opening portion 331 via the sixth opening portion 333. Moreover, the fourth opening portion 331 has an opening area matching the membrane connecting pad 32, and the fifth opening portion 332 has an opening area greater than that of the fourth opening portion 331; the sixth opening portion 333 has an opening area greater than that of the fourth opening portion 331, but smaller than that of the fifth opening portion 332. Accordingly, the second stepped opening 330 has a second two-steps opening structure with a third stepped surface 335 and a fourth stepped surface 336, as illustrated in FIG. 5.

The photographic mask 300 in the present embodiment uses the multi-layers SOI base 310 to provide the first stepped opening 320 and the second stepped opening 330 with the two-steps opening structures, which can be used forming the connecting pads 31 and 32 in the MEMS microphone chip 30. The two two-steps opening structures can further ensure the connecting pads 31 and 32 to be smaller, and improve a manufacturing accuracy of the connecting pads 31 and 32 in the MEMS microphone chip 30.

The present disclosure further provides a method for making a photographic mask, which can be used to make the photographic mask 300 as illustrated FIG. 5. The method for make the photographic mask 300 is similar to the aforesaid method for making the photographic mask 100. Referring to FIGS. 6a-6g, the method for making the photographic mask 300 mainly includes the following steps.

Figure 6A:
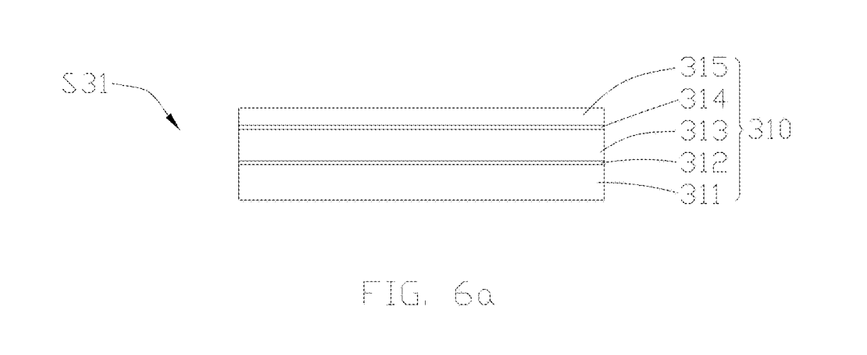
FIG. 6a-6g schematically illustrates a method for making the photographic mask of FIG. 5.

Step S31, an SOI base 310 in provided.

As illustrated in FIG. 6a, the SOI base 310 includes a silicon substrate 311, a first median insulator layer 312, a median silicon layer 313, a second median insulator layer 314 and a top silicon layer 315, which are stacked in that order from bottom to top for forming a multi-layer SOI structure.

Figure 6B:
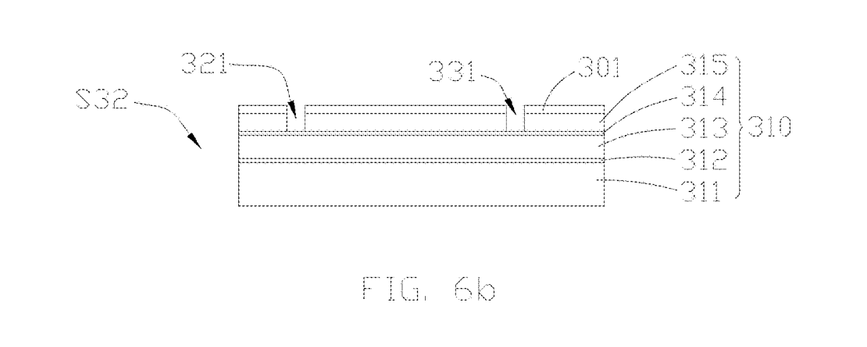

Step S32, a first photoresistor layer 301 is coated on the top silicon layer 315, and a first opening portion 321 and a fourth opening portion 331 are etched out from the top silicon layer 315 via the first photoresistor layer 301.

Referring to FIG. 6b, in step S32, a first photoresistor layer 3201 is firstly coated on the top silicon layer 315 of the SOI base 310, and then the top silicon layer 315 is etched at a first position corresponding to a to-be-formed back plate connecting pad and at a second position corresponding to a to-be-formed membrane connecting pad by DRIE process; after the DRIE process is implemented, a first opening portion 321 and a fourth opening portion 331 are respectively formed in the first position and the second position of the SOI base 310. The first opening portion 321 and the fourth opening portion 331 are both cylindrical opening portions penetrating through the top silicon layer 213.

Figure 6C:
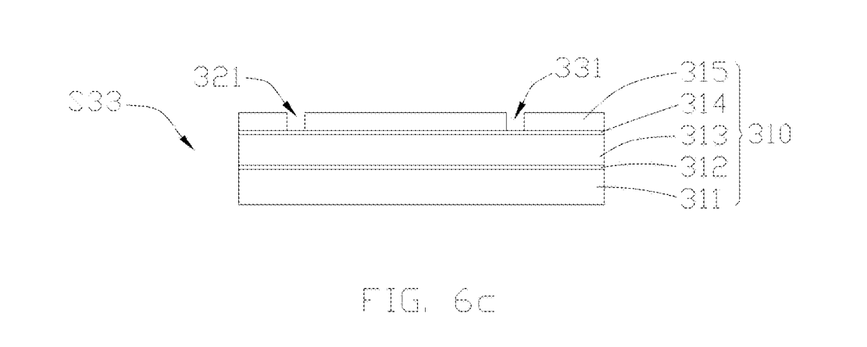

Step S33, the first photoresistor layer 301 is removed from the top silicon layer 315 after the first opening portion 321 and the fourth opening portion 331 are formed, as illustrated in FIG. 6c.

Figure 6D:
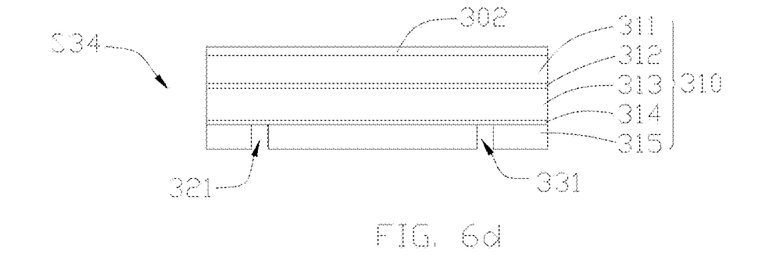

Step S34, the SOI base 310 is turned over, and a second photoresistor layer 302 is coated on the silicon substrate 311.

Referring to FIG. 6d, after the first photoresistor layer 301 is removed from the top silicon layer 315 in step S33, the SOI base 310 is turned over to make the silicon substrate 311 thereof be upward, and then a surface of the silicon substrate 311 is coated with photoresistor material to form a second photoresistor layer 302 thereon.

Figure 6E:
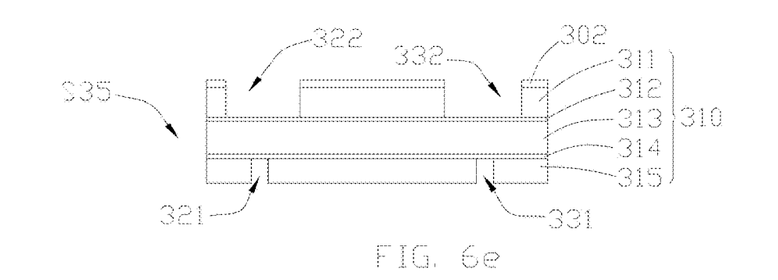

Step S35, a second opening portion 322 and a fifth opening portion 332 are etched out from the silicon base 311 via the second photoresistor layer 302.

Referring to FIG. 6e, after the second photoresistor layer 302 is coated on the silicon substrate 311, the silicon substrate 311 is etched to form the second opening portion 322 and the fifth opening portion 332 by etching process (such as DRIE process). In particular, each of the second opening portion 322 and the fifth opening portion 332 may also be a cylindrical opening portion penetrating through the silicon substrate 311, and has an opening area greater than that of the first opening portion 321 and the fourth opening portion 331. After being etched out, the second opening portion 322 and the fifth opening portion 332 are opposite to and aligned with the first opening portion 321 and the fourth opening portion 331 respectively, with the first median insulator layer 312, the median silicon layer 313 and the second median insulator layer 314 existing therebetween; and in addition, the first median insulator layer 312 exposes at the second opening portion 322 and the fifth opening portion 332.

Figure 6F:
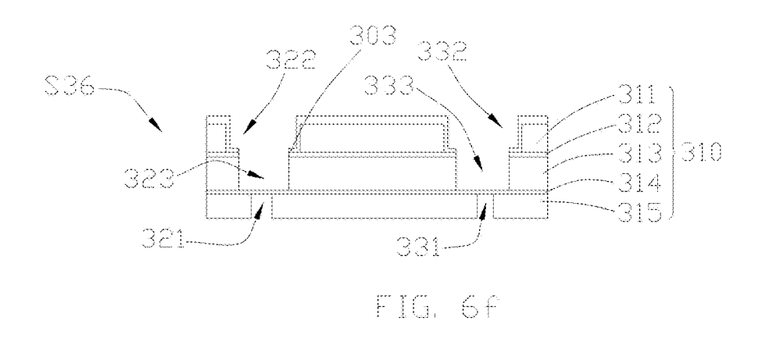

Step S36, a third photoresistor layer 303 is coated, and a third opening portion 323 and a sixth opening portion 333 are etched out from the first median insulator layer 312 and the median silicon layer 313.

Referring to FIG. 6f, in step S36, a third photoresistor layer 303 is firstly coated on the silicon substrate 311, and the third photoresistor layer 303 covers the first median insulator layer 312 exposing at the second opening portion 322 and the fifth opening portion 332; and then the first median insulator layer 312 and the median silicon layer 313 are etched from the second opening portion 322 and the fifth opening portion 332 via the third photoresistor layer 303, to form a third opening portion 323 and a sixth opening portion 333. In particular, each of the third opening portion 323 and the sixth opening portion 333 may also be a cylindrical opening portion penetrating through the first median insulator layer 312 and the median silicon layer 313, and has an opening area greater than that of the first opening portion 321 and the fourth opening portion 331, but less than that of the second opening portion 322 and the fifth opening portion 332.

After being etched out, the third opening portion 323 and the sixth opening portion 333 are opposite to and aligned with the first opening portion 321 and the fourth opening portion 331 respectively, with the second median insulator layer 314 existing therebetween; and in addition, the second median insulator layer 314 exposes at the third opening portion 323 and the sixth opening portion 333.

Figure 6G:
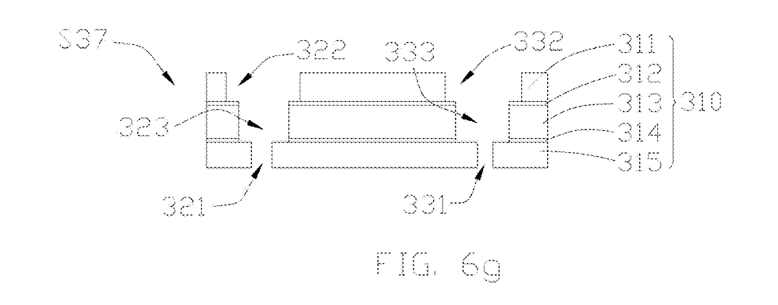

Step S37, the second median insulator layer 314 is etched via the third opening portion 323 and the sixth opening portion 333 to form a first stepped opening and a second stepped opening.

Referring to FIG. 6g, in step S37, the second median insulator layer 314 between the first opening portion 321 and the third opening portion 323, as well as between the fourth opening portion 331 and the sixth opening portion 333, is etched via the third opening portion 323 and the sixth opening portion 333. After the second median insulator layer 314 is etched, the third opening portion 323 extends to and is communicated with the first opening portion 321, and the sixth opening portion 333 extends to and is communicated with the fourth opening portion 331.

Both the third opening portion 323 and the sixth opening portion 333 penetrate through the first median insulator layer 312, the median silicon substrate 313 and the second insulator layer 214. Accordingly, a first stepped opening with a first two-steps opening structure is formed by the first opening potion 321, the second opening portion 322 and the third opening portion 323, and a second stepped opening with a second two-steps opening structure is formed by the fourth opening portion 331, the fifth opening portion 332 and the sixth opening portion 333.

It is to be understood, however, that even though numerous characteristics and advantages of the present embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for making a photographic mask used in a manufacturing process of a MEMS microphone for forming a back plate connecting pad and a membrane connecting pad in the MEM microphone chip, the method comprising:
providing a silicon-on-insulator (SOI) base, the SOI base comprising a silicon substrate, a silicon layer, and a median layer between the silicon substrate and the silicon layer;
forming a first opening portion and a third opening portion in the silicon layer, the first opening portion and the third opening portion penetrating through the silicon layer and having a first opening area and a first opening shape; the third opening portion penetrating through the silicon layer and having a third opening area and a third opening shape;
forming a second opening portion and a fourth opening portion in the silicon substrate, the second opening portion penetrating through the silicon substrate, and having a second opening area greater than the first opening area, the fourth opening portion penetrating through the silicon substrate and having a fourth opening area greater than the third opening area; and
etching the median layer to make the second opening portion be communicated with the first opening portion to form a first stepped opening, and to make the fourth opening portion be communicated with the third opening portion to form a second stepped opening; wherein
during the manufacturing process of the MEMS microphone for forming a back plate connecting pad and a membrane connecting pad in the MEM microphone chip, two deposition holes are separately provided in the MEMS microphone chip at a first position and a second position;
the photographic mask made by the method is arranged on and aligned with the MEMS microphone chip, with the first stepped opening located corresponding to the first position and the second stepped opening located corresponding to the second position;
by implementing a metal process to the hole corresponding to the first position via the first stepped opening and to the hole corresponding to the second position via the second stepped opening, the back plate connection pad and the membrane connection pad are separately formed, with the first opening area and the first opening shape matching the back plate connecting pad, and the third opening area and the third opening shape matching the membrane connecting pad.

2. The method of claim 1, wherein the first opening portion and the second opening portion are formed by respectively implementing a deep reactive ion etching (DRIE) process on the silicon layer and the silicon substrate.

3. The method of claim 1, wherein the step of etching the median layer comprises:
   etching the median layer via the second opening portion to make the second opening portion further penetrate through the median layer and extend to the first opening portion.

4. The method of claim 3, wherein the second opening portion and the first opening portion cooperatively form the first stepped opening having a single-step inner profile.

5. The method of claim 4, wherein the SOI base further comprises a first insulator layer formed on the silicon substrate, and a second insulator layer formed on the silicon layer.

6. The method of claim 5, wherein the step of forming the first opening portion comprises:
   etching the silicon layer at a predetermined position to form the first opening portion penetrating through both the silicon layer and the second insulator layer; and
   the step of forming the second opening portion comprises:
   etching the silicon substrate at the predetermined position to form the second opening portion aligned with the first opening portion and penetrating through the silicon substrate and the first insulator layer.

7. The method of claim 6, further comprising:
   forming an alignment mark arranged at a peripheral region of the stepped opening in a selected one of the first insulator layer, the second insulator layer, the silicon substrate, the silicon layer and the median layer.

8. The method of claim 1, wherein the silicon layer serves as a top silicon layer, and the median layer comprises a first median insulator layer, a second median insulator layer, and a median silicon layer arranged between the first median insulator layer and the second median insulator layer.

9. The method of claim 8, wherein the step of etching the median layer comprises:
   etching the first media insulator layer and the median silicon layer via the second opening portion to form a fifth opening portion with a fifth opening area greater than the first opening portion and smaller than the second opening portion; and
   etching the second median insulator layer to make the fifth opening portion further penetrate through the second median insulator layer and extend to the first opening portion.

10. The method of claim 9, wherein the second opening portion is communicated with the first opening portion via the fifth opening portion; the second opening portion, the fifth opening portion and the first opening portion cooperatively form a stepped opening having a two-steps inner profile.

* * * * *